United States Patent [19]

Yukawa

[11] Patent Number: 4,766,394
[45] Date of Patent: Aug. 23, 1988

[54] OPERATIONAL AMPLIFIER CIRCUIT HAVING WIDE OPERATING RANGE

[75] Inventor: Akira Yukawa, Tokyo, Japan
[73] Assignee: NEC Corporation, Tokyo, Japan
[21] Appl. No.: 94,786
[22] Filed: Sep. 10, 1987

[30] Foreign Application Priority Data

Sep. 10, 1986 [JP] Japan .................................. 61-212895
Sep. 10, 1986 [JP] Japan .................................. 61-212898
Nov. 25, 1986 [JP] Japan .................................. 61-280991

[51] Int. Cl.[4] ............................................ H03F 3/45
[52] U.S. Cl. ................................ 330/253; 330/255; 330/257; 330/258
[58] Field of Search ............... 330/253, 255, 257, 258, 330/311

[56] References Cited
U.S. PATENT DOCUMENTS
4,554,515 11/1985 Burson et al. .................. 330/257 X Primary Examiner—James B. Mullins
Attorney, Agent, or Firm—Sughrue, Mion, Zinn, Macpeak & Seas

[57] ABSTRACT

An operational amplifier circuit operable with a common-mode input voltage variable over a substantially full range between given source voltages, wherein complementary first and second differential transistor pairs each consisting of transistors having current input terminals connected together are arranged with current mirror circuits and constant-current source devices so that the first differential transistor pair is turned off and the second differential transistor pair operates as input devices for a load circuit when the common-mode input voltage approximates the lower source voltage. An increase in the common-mode input voltage causes the first differential transistor pair to turn on and gives rise to a decrease in the current flowing through the second differential transistor pair, in which instance the first differential transistor pair compensates for the reduction in the current through the second differential transistor pair by the action of the current mirror circuit associated with the two transistor pairs. The voltage applied to the load device is maintained constant without respect to the common-mode input voltage supplied to the differential transistor pairs so that there are no noises generated during transition of the common-mode input voltage through a certain voltage level.

4 Claims, 6 Drawing Sheets

OPERATIONAL AMPLIFIER CIRCUIT HAVING WIDE OPERATING RANGE

FIELD OF THE INVENTION

The present invention relates to an operational amplifier including a differential amplifier and, more particularly, to an improved operational amplifier circuit which operates stably throughout a common-mode input voltage range approximating the full range between the standard upper and lower source voltages used for semiconductor integrated circuits.

DESCRIPTION OF THE PRIOR ART

FIG. 1 of the drawings shows a basic example of a prior-art single-ended operational amplifier circuit including a differential amplifier fabricated on a semiconductor integrated circuit chip with CMOS (complementary metal-oxide-semiconductor) configuration. The operational amplifier circuit herein shown is well known in the art and is shown in, for example, D. G. Ong "Modern MOS technology: Processes, Devices, and Designs", McGraw-hill, pages 233-236 (1984). As shown, the operational amplifier circuit is provided between voltage supply lines 10 and 12 through which are to be supplied a positive source voltage $V_{DD}$ and a ground voltage $V_{SS}$, respectively, and has a pair of input terminals 14 and 16 through which inverted and non-inverted input voltages $V_{IN(-)}$ and $V_{IN(-)}$, respectively, are to be normally supplied. It may be noted that the positive source voltage $V_{DD}$ and ground voltage $V_{SS}$ to appear on the voltage supply lines 10 and 12 are herein assumed to be respectively representative of a source voltage of any desired high level and a source voltage of any desired low level lower than the former. The positive source voltage $V_{DD}$ is assumed to be of the order of 5 volts as is customary in the art of semiconductor integrated circuits of later.

The prior-art operational amplifier circuit herein shown has an input/differential-amplifier stage 18 including a differential transistor pair composed of p-channel MOS transistors 20 and 22 having their gates connected to the input terminals 14 and 16, respectively, and their sources commonly connected to the positive source voltage supply line 10 through the current path of a constant-current-source device implemented by a p-channel MOS transistor 24. The differential-pair transistors 20 and 22 further have their drains commonly connected to the ground voltage supply line 12 through a current mirror circuit 26 which operates as a load device for the differential transistor pair 20/22. The current mirror circuit 26 is composed of a pair of n-channel MOS transistors 28 and 30 having their drains respectively connected to the drains of the transistors 20 and 22 and their sources commonly connected to the ground voltage supply line 12. The transistors 28 and 30 further have their gates commonly connected to a node between the drains of the p-channel and n-channel MOS transistors 20 and 28, the transistor 28 being thus diode coupled. The constant-current-source transistor 24 sets up a bias for the differential transistor pair 20/22 and mirrors off the current which flows through the series circuit of a diode-coupled p-channel MOS transistor 32 and a saturated constant-current source device 34 serially connected between the source voltage supply lines 10 and 12.

A reference current from the transistor 20 of the differential transistor pair is passed through the diode-coupled MOS transistor 28 of the current mirror circuit 26 and the voltage developed across the transistor 28 is applied across the gate and source of the MOS transistor 30 of the current mirror circuit 26. From the input/differential-amplifier stage 18 of the circuit shown is thus produced an output current at a node between the drains of the p-channel and n-channel MOS transistors 22 and 30. The voltage thus appearing at the node between the transistors 22 and 30 is further amplified by an inverter-type gain/output stage 36 including a CMOS inverter composed of p-channel and n-channel MOS transistors 38 and 40 connected in series between the positive and ground voltage supply lines 10 and 12. The p-channel MOS transistor 38 operates as a constant-current load device for the n-channel MOS transistor 40 which has its gate connected to the node between the transistors 22 and 30 to act as an input device of the gain/output stage 36. The MOS transistor 38 also mirrors off the current flowing through the series circuit of the transistor 32 and constant-current source 34, with the gates of the transistors 24, 32 and 38 all commonly connected to the drain of the transistor 32 as shown. The gain/output stage 36 further includes a phase compensation Miller circuit including a series combination of a compensation capacitor 42 and a compensation resistor 44 connected across the gate and drain of the output transistor 40 and between the node between the transistors 22 and 30 and a node between the transistors 38 and 40 forming the inverter. Thus, the output voltage of the input/differential-amplifier stage 18 appearing at the node between the transistors 22 and 30 of the stage 18 is, upon further amplification by the gain/output stage 36, appears as an output signal $V_{OUT}$ at the node between the inverter transistors 38 and 40 and is passed over to a suitable load element or any other type of subsequent stage (not shown) through a single-ended circuit output terminal 46. As well known in the art, the capacitor 42 forming part of the phase compensation Miller circuit 42/44 serves as a pole-splitting capacitor compensating the gain stage 36 such that unity-gain feedback can be applied around the stage 36.

The prior-art CMOS configuration operational amplifier circuit of the type thus constructed and arranged operates properly in response to an analog common-mode input signal which may be as low as the second or lower source voltage on the voltage supply line 12, viz., the ground voltage $V_{SS}$ in the shown arrangement. Thus, the operational amplifier circuit under consideration is operable with a common-mode input voltage of a range having a lower limit substantially equal to the ground voltage $V_{SS}$. For consideration of the upper limit of such a common-mode input voltage range, it is supposed that common-mode voltage signals with identical amplitudes and waveforms are applied to the input terminals 14 and 16 of the input/differential-amplifier stage 18. An increase in the common-mode input voltage applied to the gate of each of the p-channel differential-pair transistors 20 and 22 will give rise to a decrease in the transconductance of each differential transistor with a resultant increase in the drain current of each of the transistors 20 and 22. The increase in the drain current of each of the differential-pair transistors 20 and 22 in turn results in an increase in the drain voltage of the associated constant-current-source transistor 24. As the drain voltage of the transistor 24 increases toward the voltage $V_{DD}$ on the positive source voltage supply line 10, the current flowing through the transistor 24 will decrease proportionately. The transistor 24 will thus be eventually disabled from acting as a constant-current-source device so that the operational amplifier stage 18 will become no longer operable properly as such. A further increase in the common-mode input voltage at the gate of each of the differential-pair transistors 20 and 22 will cause the transistors 20 and 22 to turn off with only a limited current flowing through the transistor 24. The upper limit of the common-mode input voltage for the differential-amplifier stage 18 is given as a voltage lower than the positive source voltage $V_{DD}$ by the sum of the threshold voltage $V_T$ of each of the differential-pair transistors 20 and 22 and a certain fixed voltage which is typical of the order of 1 volt. Ordinarily, the voltage thus providing the upper limit of the common-mode input voltage range for the differential-amplifier stage 18 is approximately 2 volts. Considering the fact that the positive source voltage $V_{DD}$ is usually of the order of 5 volts, such an upper limit of the common-phase input voltage operable is too low to provide a practically acceptable range between the standard upper and lower source voltages used for semiconductor integrated circuits.

Various efforts have thus far been made in an attempt to expand the operable ranges of the common-mode input voltages for operational amplifier circuits. One of such efforts has resulted in an advanced differential-input single-ended-output differential amplifier of the type shown in FIG. 2 of the drawings. The operational amplifier circuit herein shown is also of the CMOS design and is disclosed in K. Irie et al "A Single-Chip ADM LSI CODEC", IEEE Journal of Solid State Circuits, Vol. SC-18, No. 1, pages 36–37, February 1983. The prior-art operational amplifier circuit is largely composed of a complementary input/differential-amplifier stage 50 and an inverter-type gain/output stage 52. The input/differential-amplifier stage 50 includes a first differential transistor pair 54 composed of p-channel MOS transistors 56 and 58 and a second differential transistor pair 60 composed of n-channel MOS transistors 62 and 64. The p-channel MOS transistor 56 of the first differential transistor pair 54 and the n-channel MOS transistor 62 of the second differential transistor pair 60 have their gates commonly connected to one input terminal 14 and the p-channel MOS transistor 58 of the first differential transistor pair 54 and the n-channel MOS transistor 64 of the second differential transistor pair 60 have their gates commonly connected to the other input terminal 16. The transistors 56 and 58 of the first differential transistor pair 54 have their sources commonly connected to a positive source voltage supply line 10 through the current path of a first constant-current-source device implemented by a p-channel MOS transistor 66. Likewise, the transistors 62 and 64 of the second differential transistor pair 60 have their sources commonly connected to a ground voltage supply line 12 through the current path of a second constant-current-source device implemented by an n-channel MOS transistor 68. The transistors 56 and 58 of the first differential transistor pair 54 further have their drains connected to the drains of the transistors 62 and 64, respectively, of the second differential transistor pair 60.

In association with the first differential transistor pair 54 is provided a first current mirror circuit 70 composed of a pair of n-channel MOS transistors 72 and 74 for operating as a load device for the differential transistor pair 54. Associated with the second differential transistor pair 60 is likewise provided a second current mirror circuit 76 composed of a pair of p-channel MOS transistors 78 and 80 for operating as a load device for the differential transistor pair 60. The transistors 72 and 74 of the first current mirror circuit 70 have their sources commonly connected to the ground voltage supply line 12 while the transistors 78 and 80 of the second current mirror circuit 76 have their sources commonly connected to the positive source voltage supply line 10. The n-channel and p-channel MOS transistors 72 and 78 of the first and second current mirror circuits 70 and 76, respectively, have their drains connected commonly to a node between the drains of the transistors 56 and 62 of the first and second differential transistor pairs 54 and 60 and, similarly, the n-channel and p-channel MOS transistors 74 and 80 of the current mirror circuits 70 and 76, respectively, have their drains connected commonly to a node between the drains of the transistors 58 and 64 of the differential transistor pairs 54 and 60. All the MOS transistors 72, 74, 78 and 80 of the first and second current mirror circuits 70 and 76 have their respective gates connected to a node between the drains of the transistors 72 and 78 of the current mirror circuits 70 and 76, respectively, and accordingly to the node between the drains of the transistors 56 and 62 of the first and second differential transistor pairs 54 and 60, respectively, as shown. The first constant-current-source transistor 66 has its gate connected to a low-level bias voltage supply terminal 82 to set up a high-level bias voltage $V_{B1}$ for the transistor 66. Likewise, the second constant-current-source transistor 68 has its gate connected to a high-level bias voltage supply terminal 84 to set up a low-level bias voltage $V_{B2}$ for the transistor 68.

From the complementary input/differential-amplifier stage 50 of the circuit is produced an output current at a node among the respective drains of the transistors 58, 64, 74 and 80. The voltage thus appearing at this node is further amplified by the inverter-type gain/output stage 52 which includes a CMOS inverter composed of p-channel and n-channel MOS transistors 86 and 88 connected in series between the positive and ground voltage supply lines 10 and 12. The gates of the and the n-channel MOS transistor 88 are connected to the output terminal of the input/differential-amplifier stage 50 to act as an input device of the gain/output stage 52. The gain/output stage 52 further includes a phase compensation Miller circuit including a series combination of a compensation capacitor 90 and a compensation resistor 92 connected across the gate and drain of each of the transistors 86 and 88 and between a node between the inverter transistors 86 and 88 and the output terminal of the input/differential-amplifier stage 50. Thus, the output voltage of the stage 50 is, upon further amplification by the gain/output stage 52, appears as an output signal $V_{OUT}$ at the node between the inverter transistors 86 and 88 and is passed over to a suitable load element or any subsequent circuit stage (not shown) through a single-ended circuit output terminal 46.

The advanced prior-art CMOS operational amplifier of the type thus constructed and arranged also operates properly in response to an analog common-mode input signal which may be as low as the ground voltage $V_{SS}$ to appear on the voltage supply line 12. An increase in the common-mode input voltage applied the gate of, for example, each of the transistors 56 and 58 of the first differential transistor pair 54 will give rise to an increase in the drain current of each of the differential-pair transistors 56 and 58. The constant-current-source transistor 66 associated with the first differential transistor pair 54 will thus be disabled as the current flowing through the transistor 66 decreases with the drain voltage of the transistor 66 increasing toward the voltage $V_{DD}$ due to the increase in the drain current of each of the differential-pair transistors 56 and 58. A further increase in the common-mode input voltage applied to the gate of each of the differential-pair transistors 56 and 58 will cause the transistors 56 and 58 to turn off. Before the differential-pair transistors 56 and 58 are thus caused to turn off, however, the second differential transistor pair 60 which is responsive to the same common-mode input voltage is enabled to operate to take the place of the first differential transistor pair 54 through the constant-current-source transistor 68 associated with the differential transistor pair 60. It therefore follows that the first and second differential transistor pairs 54 and 60 of the input/differential-amplifier stage 50 compensate each other so that the stage 50 as a whole is allowed to remain operative. The prior-art differential amplifier circuit herein shown is in this manner operable properly without respect to the variation in the common-mode input voltage. The range of the common-mode input voltage permitting the circuit to operate properly is wider than that for the prior-art circuit of FIG. 1 but is still limited within a range of from 1.2 volt to 4.7 volts for the positive source voltage $V_{DD}$ of 5 volts as reported by K. Irie et al.

FIG. 3 of the drawings shows another example of the differential-input single-ended-output operational amplifiers which have resulted from the efforts made to enlarge the operable ranges of the common-mode input voltages for differential amplifier circuits. The operational amplifier circuit herein shown is of the bipolar design and is disclosed in J. H. Huijising et al "A ±0.75V Opamp with Rail-to-Rail Input/Output Range", ISSCC '85 Digest of Technical Papers, pages 136–137, February 1985. The prior-art differential amplifier circuit is largely composed of a complementary input/differential-amplifier stage 91 and a summing circuit 94. The input/differential-amplifier stage 91 includes a first differential transistor pair composed of emitter-coupled n-p-n transistors 96 and 98 and a second differential transistor pair composed of emitter-coupled p-n-p transistors 100 and 102. The n-p-n transistor 96 of the first differential transistor pair and the p-n-p transistor 100 of the second differential transistor pair have their bases commonly connected to one input terminal 14 and the n-p-n transistor 98 of the first differential transistor pair and the p-n-p transistor 102 of the second differential transistor pair have their bases commonly connected to the other input terminal 16. The transistors 96 and 98 of the first differential transistor pair have their collectors commonly connected to a positive source voltage supply line 10 through resistors 104 and 106, respectively. Likewise, the transistors 100 and 102 of the second differential transistor pair have their collectors commonly connected to a ground voltage supply line 12 through resistors 108 and 110, respectively. The transistors 100 and 102 of the second differential transistor pair further have their emitters connected to the positive source voltage supply line 10 through a saturated constant-current source device 112. Thus, the first differential transistor pair composed of the n-p-n transistors 96 and 98 is operative to produce between the collectors thereof a first output signal $D_1$ of the input/differential-amplifier stage 91. Likewise, the second differential transistor pair composed of the p-n-p transistors 100 and 102 is operative to produce between the collectors thereof a second output signal $D_2$ of the stage 91, the second output signal $D_2$ being complementary to the first output signal $D_1$.

The input/differential-amplifier stage 91 further includes a voltage-controlled current-source device implemented by a p-n-p transistor 114, and a current mirror circuit 116 composed of a pair of n-p-n transistors 118 and 120 for operating as a load device for each of the differential transistor pairs 96/98 and 100/102. The constant-current-source transistor 114 has its emitter connected to the positive source voltage supply line 10 through the constant-current source device 112 and its base connected to a constant-voltage source device (not shown) operative to establish a fixed bias voltage $V_{R1}$. The transistors 118 and 120 forming the current mirror circuit 116 have their bases connected together and their emitters commonly connected to the ground voltage supply line 12. One of these transistors 118 and 120 is a diode-coupled device having its base and collector connected to the collector of the constant-current-source transistor 114 and the other has its collector connected to a node between the emitters of the transistors 96 and 98 of the first differential transistor pair.

The complementary first and second output signals $D_1$ and $D_2$ produced from the input/differential-amplifier stage 91 are summed up by means of the summing circuit 94. The summing circuit 94 includes a pair of p-n-p transistors 122 and 124 which have their bases commonly connected to a constant voltage source device (not shown) for establishing a fixed bias voltage $F_{R2}$ at the base of each of the transistors 122 and 124. The transistors 122 and 124 further have their emitters respectively connected to the collectors of the transistors 96 and 98 of the first differential transistor pair and are thus responsive to the first output signal $D_1$ of the input/differential-amplifier stage 91. The summing circuit 94 further includes a current mirror circuit 126 composed of a pair of n-p-n transistors 128 and 130 having their bases connected together and their emitters respectively connected to the collectors of the transistors 100 and 102 of the second differential transistor pair and are thus responsive to the second output signal $D_2$ of the input/differential-amplifier stage 91. One of these transistors 128 and 130 is a diode-coupled device having its base and collector connected to the collector of the transistor 122 and the other has its collector connected to the collector of the transistor 124. Thus, the summing circuit 94 has a single-ended circuit output terminal 132 connected to a node between the respective collectors of the p-n-p and n-p-n transistors 124 and 130 and produces an output signal $V_{OUT}$ at the output terminal 132.

The prior-art bipolar operational amplifier circuit constructed and arranged as hereinbefore described basically has two different modes of operation. One mode of operation is established when the common-mode voltage appearing at the input terminals 14 and 16 is lower than the bias voltage $V_{R1}$ appearing at the base of the constant-current-source transistor 114. With such a bias voltage $V_{R1}$, the regulation transistor 114 is turned off so that there is no current flowing through the current mirror circuit 116 composed of the transistors 118 and 120. Under these conditions, the operational amplifier circuit acts as an operational amplifier loaded by a folded cascode circuit formed by the transistors 122, 124, 128 and 130 and resistors 104, 106, 108 and 110 with an input voltage ($D_2$) appearing between the collectors of the differential-pair transistors 100 and 102. Such an operational amplifier circuit is operable on a common-mode input voltage which may be as low as the voltage $V_{SS}$ appearing at the ground voltage supply line 12.

The operational amplifier circuit shifts to the other mode of operation when the common-mode input voltage rises beyond the bias voltage $V_{R1}$ at the base of the constant-current-source transistor 114. When the transistor 114 is turned on before the constant-current source device 112 is disabled to act as such, the current from the constant-current source device 112 flows totally through the constant-current-source transistor 114 so that the second differential transistor pair composed of the transistors 100 and 102 is disabled. The current thus flowing through the constant-current-source transistor 114 is applied to the transistors 118 and 120 forming the current mirror circuit 116, which therefore allows currents to flow through the transistors 96 and 98 of the first differential transistor pair. Under these conditions, the operational amplifier circuit acts as an operational amplifier loaded by a folded cascode circuit formed by the transistors 122, 124, 128 and 130 and resistors 104, 106, 108 and 110 with an input voltage ($D_1$) appearing between the collectors of the differential-pair transistors 96 and 98. Such an operational amplifier circuit is operable on a common-mode input voltage which may be as high as the voltage $V_{DD}$ appearing at the positive source voltage supply line 10. In conclusion, the prior-art operational amplifier circuit of the design shown in FIG. 3 is operable on a common-mode input voltage which may be variable throughout the range between the upper and lower source voltages supplied to the voltage supply lines 10 and 12.

During the first mode of operation of the circuit shown in FIG. 3, the current which has flown through the resistor 104 is totally passed over to the transistor 122 and likewise the current which has flown through the resistor 106 is totally passed over to the transistor 124 of the summing circuit 94. In addition, the current which has flown through the transistor 100 of of the second differential transistor pair is totally passed over to the resistor 108 and likewise the current which has flown through the transistor 102 of the second differential transistor pair is totally passed over to the resistor 110. These mean that the current which flows through the resistor 108 equals the sum of the current flowing through the resistor 104 and the current flowing through the transistor 100 and, likewise, the current which flows through the resistor 110 equals the sum of the current flowing through the resistor 106 and the current flowing through transistor 102. During the second mode of operation, the current which flows through the resistor 104 equals the sum of the current flowing through the resistor 108 and the current flowing through transistor 96 of the first differential transistor pair and, likewise, the current which flows through the resistor 106 equals the sum of the current flowing through the resistor 110 and the current flowing through transistor 98 of the first differential transistor pair. Thus, the current which flows through each of the resistors 104 and 106 and the current which flows through each of the resistors 108 and 110 are caused to change when a shift is made between the two modes of operation. This means that the operational amplifier circuit produces switching noises as the common-mode input voltage applied to the input terminals 14 and 16 upwardly or downwardly crosses the bias voltage established at the base of the constant-current-source transistor 114. Such switching noises will result in significant distortion in the output waveform of the operational amplifier circuit.

In FIG. 4 of the drawings is shown still another example of a known differential-input single-ended-output differential amplifier developed in an effort to enlarge the driving capability of the output voltage. The operational amplifier circuit herein shown is of the CMOS configuration and is disclosed in IEEE Journal of Solid State Circuits, December 1983. The prior-art operational amplifier circuit herein shown is specifically adapted to drive a large load by low power and includes three differential amplifiers consisting of first, second and third differential amplifiers 134, 136 and 138 each having inverting and non-inverting input terminals. The first differential amplifier 134 has its inverting and non-inverting input terminals providing a pair of input terminals 14 and 16 of the entire operational amplifier circuit. The first differential amplifier 134 has its output terminal connected to the gate of a p-channel MOS transistor 140 which has its source connected to a positive source voltage supply line 10. The MOS transistor 140 further has its drain connected to a ground voltage supply line 12 through a series combination of a diode-coupled n-channel MOS transistor 142 and a first constant-current-source device implemented by an n-channel MOS transistor 144. The MOS transistor 144 has its drain connected to the source of the transistor 142 and its source connected to the ground voltage supply line 12. The respective drains of the serially connected transistors 140 and 142 have therebetween a node connected through a phase compensator capacitor 146 to the differential amplifier 134 and to the inverting input terminal of the second differential amplifier 136 as shown. The series combination of the transistors 140, 142 and 144 is paralleled by a series combination of an n-channel MOS transistor 148 and an n-channel MOS transistor 150 which implements a second constant-current-source device. The MOS transistor 148 has its drain directly connected to the positive source voltage supply line 10 and its source connected to the drain of the MOS transistor 150 which has its source connected to the ground voltage supply line 12. The transistors 144 and 150 each implementing a constant-current-source device have their gates connected to bias voltage supply terminals 152 and 154, respectively, for setting up high-level bias voltages $V_{B1}$ and $V_{B2}$ for the n-channel MOS transistors 144 and 150. Furthermore, the serially connected transistors 142 and 144 have therebetween a node connected to the inverting input terminal of the third differential amplifier 138 and, likewise, the serially connected transistors 148 and 150 have therebetween a node connected to the non-inverting input terminal of the differential amplifier 138 as shown.

The second differential amplifier 13 has its output terminal connected to the gates of p-channel MOS transistors 156 and 158 each having its source connected to the positive source voltage supply line 10. The MOS transistor 156 has its drain connected to the ground voltage supply line 12 through an n-channel MOS transistor 160 which has its gate connected to the output terminal of the third differential amplifier 138 and its source connected to the ground voltage supply line 12. The serially connected transistors 156 and 160 have between the respective drains thereof a node connected to the non-inverting input terminal of the second differential amplifier 136 and to the gate of the transistor 148.

The p-channel MOS transistor 158 has its drain connected to the ground voltage supply line 12 through a diode-coupled n-channel MOS transistor 162 and a current mirror circuit 164 composed of a pair of n-channel MOS transistors 166 and 168 having their gates connected together. The diode-coupled n-channel MOS transistor 162 has its drain connected to the drain of the transistor 158 and its source connected to the gate-drain coupled transistor 166 of the current mirror circuit 164. The other transistor 168 of the current mirror circuit 164 has its drain connected to the node between the transistors 148 and 150 and its source connected to the ground voltage supply line 12 similarly to the source of the associated transistor 166 as shown. The operational amplifier circuit thus constructed and arranged has a single-ended circuit output terminal 170 connected to the node between the respective drains of the p-channel and n-channel MOS transistors 156 and 160 and produces an output signal $V_{OUT}$ at the output terminal 170.

The output signal from the first differential amplifier 134 is further amplified by an inverting amplifier circuit including a driver device implemented by the transistor 140 and a constant-current device implemented by the transistor 144. The resultant amplified signal has its impedance reduced by means of a voltage follower formed by the second differential amplifier 136 and the associated p-channel MOS transistor 156 and a voltage follower formed by the third differential amplifier 138 and the associated n-channel MOS transistor 160. The transistors 142, 148, 158 and 162 and the current mirror circuit 164 form part of a protective transistor circuit to protect the transistors 156 and 160 from unusually large currents which may attempt to flow therethrough depending upon the offset voltages of the differential amplifiers 136 and 138.

The prior-art operational amplifier circuit thus constructed is capable of driving sufficiently large loads where the supplied voltage and current are of significantly high orders. Where each of the differential amplifiers 136 and 138 is constructed by, for example, the simple prior-art operational amplifier circuit described with reference to FIG. 1, the common-mode input voltage operable for the operational amplifier circuit has lower and upper limits as discussed previously so that the output voltage which can be achieved of the circuit inevitably has a narrow operable range. Another important problem inherent in the operational amplifier circuit of the type shown in FIG. 4 is the objectionable effect of the protective transistor circuit which is inevitably contributes to substantial distortion of the output voltage in the vicinity of the voltage level intermediate the upper and lower source voltages used.

It is, accordingly, an important object of the present invention to provide an improved single-ended operational amplifier circuit which is operable on a common-mode input voltage variable over the full range between the given upper and lower source voltages and which is free from production of switching noises which would otherwise be produced during transition of the common-mode input voltage through a certain reference level.

SUMMARY OF THE INVENTION

In accordance with the present invention, there is provided an operational amplifier circuit comprising (a) first and second source voltage supply lines, (b) a pair of input terminals, (c) a first differential transistor pair consisting of first and second transistors of a first conductivity type, the first and second transistors having respective control terminals connected to the input terminals, respectively, of the circuit and respective current input terminals connected together, each of the first and second transistors further having a current output terminal, (d) a second differential transistor pair consisting of third and fourth transistors of a second conductivity type opposite to the first conductivity type, the third and fourth transistors having respective control terminals also connected to the input terminals, respectively, of the circuit and respective current input terminals connected together, each of the third and fourth transistors further having a current output terminal, (e) a first current mirror circuit responsive to the current on the first source voltage supply line and having an input terminal connected to the current output terminal of the first transistor and an output terminal connected to the current output terminal of the fourth transistor through a first node, (f) a second current mirror circuit responsive to the current on the first source voltage supply line and having an input terminal connected to the current output terminal of the second transistor and an output terminal connected to the current output terminal of the third transistor through a second node, (g) a third current mirror circuit responsive to the current on the first source voltage supply line and having an input terminal connected to the current input terminal of each of the first and second transistors and an output terminal connected to the current input terminal of each of the third and fourth transistors, (h) reference voltage generator means operative to produce predetermined first and second reference voltages, (i) a first constant-current source device responsive to the first reference voltage and connected between the input terminal of the third current mirror circuit and the current input terminal of each of the first and second transistors, (j) a second constant-current source device responsive to the second reference voltage and connected between the second source voltage supply line and the current input terminal of each of the first and second transistors, (k) a fourth current mirror circuit responsive to the current on the second source voltage supply line and having an input terminal connected to the first node and an output terminal connected to the second node, and (l) inverting amplifier means having an input terminal connected to the second node and an output terminal, the inverting amplifier means comprising a phase compensation circuit connected between the input and output terminals thereof.

In accordance with another outstanding aspect of the present invention, there is provided an operational amplifier circuit comprising (a) first and second source voltage supply lines, (b) a pair of input terminals, (c) a first differential transistor pair consisting of first and second transistors of a first conductivity type, the first and second transistors having respective control terminals connected to the input terminals, respectively, of the circuit, and respective current input terminals connected together, each of the first and second transistors further having a current output terminal, (d) a second differential transistor pair consisting of third and fourth transistors of a second conductivity type opposite to the first conductivity type, the third and fourth transistors having respective control terminals also connected to the input terminals, respectively, of the circuit and respective current input terminals connected together, each of the third and fourth transistors further having a current output terminal, (e) a first current mirror circuit responsive to the current on the first source voltage supply line and having an input terminal connected to the current output terminal of the first transistor and an output terminal connected to the current output terminal of the fourth transistor through a first node, (f) a second current mirror circuit responsive to the current on the first source voltage supply line and having an input terminal connected to the current output terminal of the second transistor and an output terminal connected to the current output terminal of the third transistor through a second node, (g) a third current mirror circuit responsive to the current on the first source voltage supply line and having an input terminal connected to the current input terminal of each of the first and second transistors and an output terminal connected to the current input terminal of each of the third and fourth transistors, (h) reference voltage generator means operative to produce predetermined first and second reference voltages, (i) a first constant-current source device responsive to the first reference voltage and connected between the input terminal of the third current mirror circuit and the current input terminal of each of the first and second transistors, (j) a second constant-current source device responsive to the second reference voltage and connected between the second source voltage supply line and the current input terminal of each of the first and second transistors, (k) a third constant-current source device responsive to the second reference voltage and connected between the second source voltage supply line and the second node, (l) a fourth constant-current source device responsive to the second reference voltage and connected between the second source voltage supply line and the first node, (m) a fourth current mirror circuit responsive to the current on the first source voltage supply line and having an input terminal connected to the third constant-current source device through a first load device and an output terminal connected to the fourth constant-current source device through a second load device, (n) each of the first and second load devices being responsive to the first reference voltage, and (o) inverting amplifier means having an input terminal connected to the output terminal of the fourth current mirror circuit and an output terminal, the inverting amplifier means comprising a phase compensation circuit connected between the input and output terminals thereof.

In accordance with still another outstanding aspect of the present invention, there is provided an operational amplifier circuit comprising (a) first and second source voltage supply lines, (b) a pair of input terminals, (c) a first differential transistor pair consisting of first and second transistors of a first conductivity type, the first and second transistors having respective control terminals connected to the input terminals, respectively, of the circuit and respective current input terminals connected together, each of the first and second transistors further having a current output terminal, (d) a second differential transistor pair consisting of third and fourth transistors of a second conductivity type opposite to the first conductivity type, the third and fourth transistors having respective control terminals also connected to the input terminals, respectively, of the circuit and respective current input terminals connected together, each of the third and fourth transistors further having a current output terminal, (e) a first current mirror circuit responsive to the current on the first source voltage supply line and having an input terminal connected to the current output terminal of the second transistor and an output terminal connected to the current output terminal of the third transistor through a first node, (f) a second current mirror circuit responsive to the current on the first source voltage supply line and having an input terminal connected to the current input terminal of each of the first and second transistors and an output terminal connected to the current input terminal of each of the third and fourth transistors, (g) a third current mirror circuit responsive to the current on the second source voltage supply line and having an input terminal connected to the current output terminal of the fourth transistor and an output terminal connected to the current output terminal of the first transistor through a second node, (h) reference voltage generator means operative to produce predetermined first, second and third reference voltages, (i) a first constant-current source device responsive to the first reference voltage and connected between the input terminal of the second current mirror circuit and the current input terminal of each of the first and second transistors, (j) a second constant-current source device responsive to the second reference voltage and connected between the second source voltage supply line and the current input terminal of each of the first and second transistors, (k) a first load circuit responsive to the third reference voltage and having a current input terminal connected to the first source voltage supply line and a current output terminal connected to the second node, (l) a second load circuit responsive to the second reference voltage and having a current input terminal connected to the second source voltage supply line and a current output terminal connected to the first node, and (m) operational amplifier means having input terminals connected to the current output terminals of the first and second load circuits and an output terminal, the operational amplifier means comprising phase compensation means connected between each of the input terminals and the output terminal thereof.

BRIEF DESCRIPTION OF THE DRAWINGS

The features and advantages of an operational amplifier according to the present invention will be more clearly appreciated from the following description taken in conjunction with the accompanying drawings in which.

DESCRIPTION OF THE PREFERRED EMBODIMENTS

Figure 1:
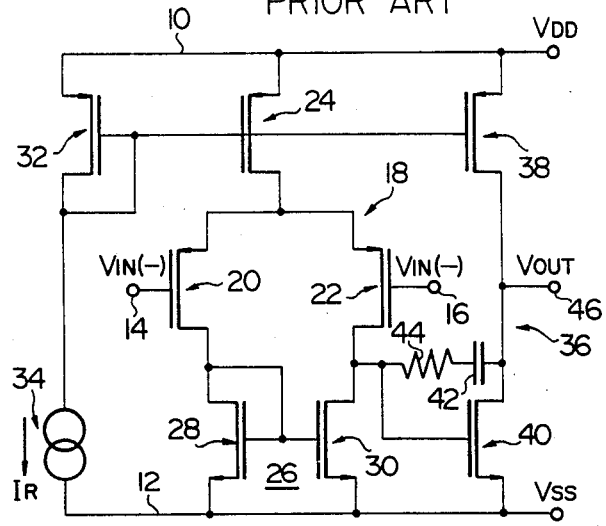
FIG. 1 is a circuit diagram showing a basic example of prior-art on-chip operational amplifier with CMOS configuration.
Figure 2:
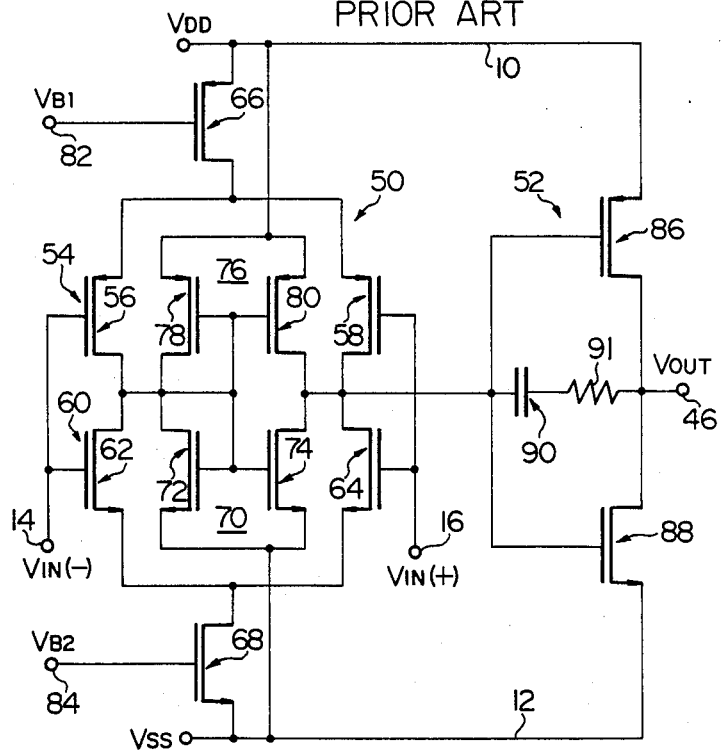
FIG. 2 is a circuit diagram showing another example of a prior-art on-chip operational amplifier with CMOS configuration.
Figure 3:
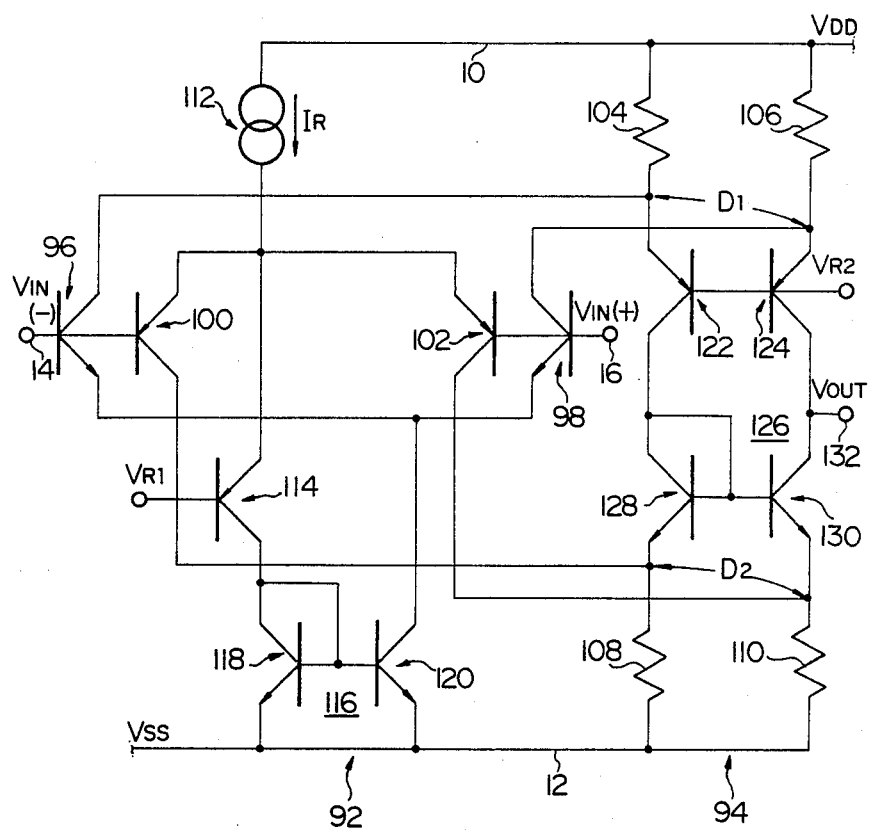
FIG. 3 is a circuit diagram showing still another example of a prior-art on-chip operational amplifier with CMOS configuration.
Figure 4:
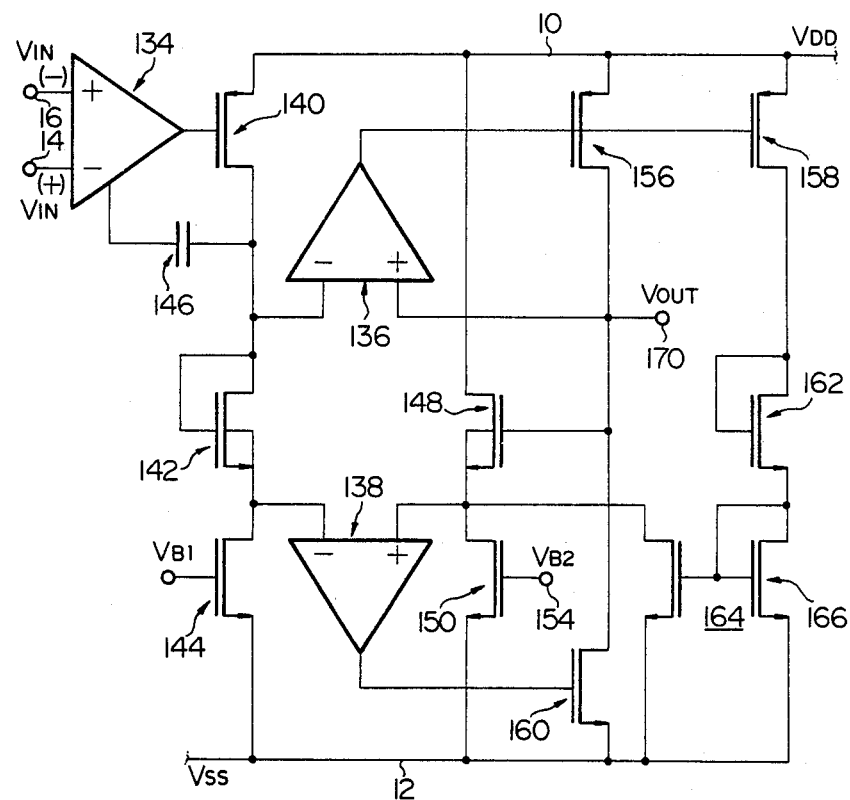
FIG. 4 is a circuit diagram showing a representative example of a prior-art on-chip operational amplifier with bipolar device configuration.
Figure 5:
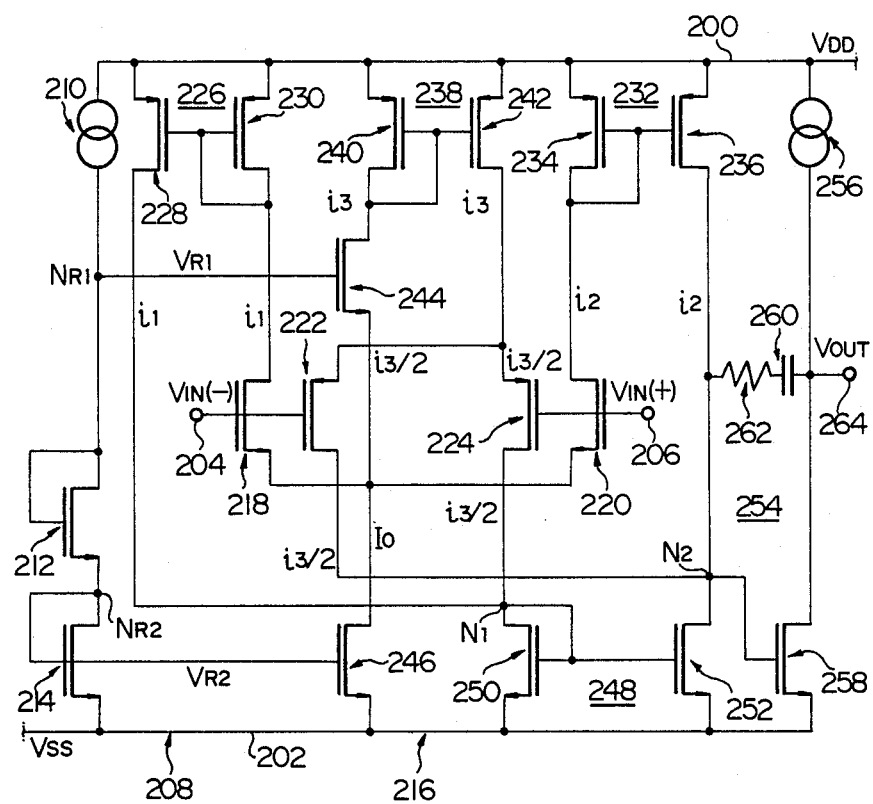
FIG. 5 is a circuit diagram showing a first preferred embodiment of a single-ended operational amplifier circuit according to the present invention.

Referring to FIG. 5, a single-ended operational amplifier circuit embodying the present invention is provided between voltage supply lines 200 and 202 through which are to be supplied a high-level source voltage $V_{DD}$ and a low-level source voltage $V_{SS}$, respectively. The high-level source voltage $V_{DD}$ is assumed to be of the order of 5 volts as is customary in the art and the low-level source voltage $V_{SS}$ assumed to be of ground level.

The operational amplifier circuit embodying the present invention has a pair of input terminals 204 and 206 through which inverted and non-inverted input voltages $V_{IN(-)}$ and $V_{IN(-)}$, respectively, are to be normally supplied. The operational amplifier circuit shown further has a reference voltage generator stage 208 which consists essentially of a series combination of a saturated constant-current source device 210 and load devices implemented by diode-coupled n-channel MOS transistors 212 and 214 serially connected between the source voltage supply lines 200 and 202. The n-channel MOS transistor 212 has its gate and drain connected to the high-level source voltage supply line 200 through the constant-current source device 210, and the n-channel MOS transistor 214 has its gate and drain connected to the source of the MOS transistor 212 and its source connected directly to the low-level source voltage supply line 202. Thus, the reference voltage generator stage 208 is operative to produce a first reference voltage $V_{R1}$ at a node $N_{RR1}$ between the constant-current source device 210 and the diode-coupled n-channel MOS transistor 212 and a second reference voltage $V_{R2}$ at a node $N_{R2}$ between the diode-coupled n-channel MOS transistors 212 and 214. It will be apparent that the second reference voltage $V_{R2}$ at the node $N_{R2}$ is lower than the first reference voltage $V_{R1}$ at the node $N_{R1}$ by a value approximately equal to the threshold voltage of the transistor 212.

The operational amplifier circuit embodying the present invention further has an input/differential-amplifier stage 216 which comprises a first differential transistor pair consisting of source-coupled n-channel MOS transistors 218 and 220 and a second differential transistor pair consisting of source-coupled p-channel MOS transistors 222 and 224. One n-channel MOS transistor 218 of the first differential transistor pair and one p-channel MOS transistor 222 of the second differential transistor pair have their respective gates connected to one input terminal 204 of the operational amplifier circuit and the other n-channel MOS transistor 220 of the first differential transistor pair and the other p-channel MOS transistor 224 of the second differential transistor pair have their respective gates connected to the other input terminal 206 of the differential amplifier circuit. The input/differential-amplifier stage 216 further comprises a first current mirror circuit 226 consisting of a p-channel MOS transistor 228 and a diode-coupled p-channel MOS transistor 230, a second current mirror circuit 232 consisting of a diode-coupled p-channel MOS transistor 234 and a p-channel MOS transistor 236, and a third current mirror circuit 238 consisting of a diode-coupled p-channel MOS transistor 240 and a p-channel MOS transistor 242. The p-channel MOS transistors 228 and 230 forming the first current mirror circuit 226 have their gates connected together and their sources connected directly to the high-level source voltage supply line 200. Thus, the first current mirror circuit 226 has an input node connected to the gates of the transistors 228 and 230 and to the drain of the diode-coupled transistor 230 and an output node connected to the drain of the transistor 228. On the other hand, the p-channel MOS transistors 234 and 236 forming the second current mirror circuit 232 have their gates connected together and their sources connected directly to the high-level source voltage supply line 200. The second current mirror circuit 232 has an input node connected to the gates of the transistors 234 and 236 and to the drain of the diode-coupled transistor 234 and an output node connected to the drain of the transistor 246. Furthermore, the p-channel MOS transistors 240 and 242 forming the third current mirror circuit 238 have their gates connected together and their sources connected directly to the high-level source voltage supply line 200. The third current mirror circuit 238 has an input node connected to the gates of the transistors 240 and 242 and to the drain of the diode-coupled transistor 240 and an output node connected to the drain of the transistor 242. The first current mirror circuit 226 has its input node connected to the drain of one n-channel MOS transistor 218 of the first differential transistor pair 218/220 and its output node connected to the drain of one p-channel MOS transistor 224 of the second differential transistor pair 222/224. The second current mirror circuit 232 has its input node connected to the drain of the other n-channel MOS transistor 220 of the first differential transistor pair 218/220 and its output node connected to the drain of the other p-channel MOS transistor 222 of the second differential transistor pair 222/224. On the other hand, the third current mirror circuit 238 has its input node connected through the current path of an n-channel MOS transistor 244 to the common sources of the n-channel MOS transistors 218 and 220 of the first differential transistor pair 218/220 and its output node connected directly to the common sources of the p-channel MOS transistors 222 and 224 of the second differential transistor pair 222/224. The input node of the third current mirror circuit 238 is further connected to the low-level source voltage supply line 202 through the transistor 244 and the current path of an n-channel MOS transistor 236. The n-channel MOS transistors 244 and 246 are thus serially connected between the input node of the third current mirror circuit 238 and the low-level source voltage supply line 202 and ahve their gates connected to the first and second reference voltage nodes $N_{R1}$ and $N_{R2}$ of the reference voltage generator stage 208, respectively. More specifically, the n-channel MOS transistor 244 has its gate connected to the node $N_{R1}$ between the constant-current source device 210 and the diode-coupled n-channel MOS transistor 212 and the n-channel MOS transistor 246 has its gate connected to the node $N_{R2}$ between the diode-coupled n-channel MOS transistors 212 and 214. The transistor 246 implements a constant-current-source device and the transistor 244 implements a current steering device which regulates the mode of operation of the differential amplifier circuit. By the first and second reference voltages $V_{R1}$ and $V_{R2}$ produced by the reference voltage generator stage 208 are controlled the current from these transistors 244 and 246. The transistors 244 and 246 will thus be hereinafter referred to as a mode regulating transistor and a current-source transistor, respectively.

The input/differential-amplifier stage 216 further comprises a fourth current mirror circuit 248 consisting of a diode-coupled n-channel MOS transistor 250 and an n-channel MOS transistor 252. The n-channel MOS transistors 250 and 252 forming the fourth current mirror circuit 248 have their gates connected together and their sources connected directly to the low-level source voltage supply line 202. The fourth current mirror circuit 248 has an input node $N_1$ connected to the drain of the p-channel MOS transistor 228 forming part of the first current mirror circuit 226 and the drain of the p-channel MOS transistor 224 forming part of the second differential transistor pair 222/224 and an output node $N_2$ connected to the drain of the p-channel MOS transistor 236 forming part of the second current mirror circuit 232 and the drain of one p-channel MOS transistor 222 of the second differential transistor pair 222/224. Thus, the input/differential-amplifier stage 216 has an output voltage appearing at the output node $N_2$ of the fourth current mirror circuit 248.

The operational amplifier circuit embodying the present invention further comprises an inverting gain/output stage 254 which is operative to further amplify the voltage thus appearing at the output node $N_2$ of the fourth current mirror circuit 248. The inverting gain/output stage 254 comprises a series combination of a saturated constant-current source device 256 and an input device implemented by an n-channel MOS transistor 258 connected between the source voltage supply lines 200 and 202. The n-channel MOS transistor 258 has its gate connected to the output node $N_2$ of the fourth current mirror circuit 248, its drain connected to the high-level source voltage supply line 200 through the constant-current source device 256, and its source connected directly to the low-level source voltage supply line 202. The gain/output stage 254 further comprises a phase compensation Miller circuit comprising a series combination of a compensation capacitor 260 and a compensation resistor 264 connected across the gate and drain of the input transistor 258 and between the output node $N_2$ of the fourth current mirror circuit 248 and a node between the constant-current source device 256 and the input transistor 258. Thus, the output voltage of the input/differential-amplifier stage 216 as appearing at the output node $N_2$ of the fourth current mirror circuit 248 is, upon further amplification by the gain/output stage 254, appears as an output signal $V_{OUT}$ at the node between the constant-current source device 256 and the input transistor 258 and is passed over to a suitable load element or any other type of subsequent circuit stage (not shown) through a single-ended circuit output terminal 264. The compensating resistor 262 may be provided in the form of a CMOS transfer gate having the gate of one transistor connected to the high-level source voltage supply line 200 and the gate of the other transistor connected to the low-level source voltage supply line 202, though not shown in the drawing. The inverting gain/output stage 252 thus constructed and arranged is simply provided to amplify the voltage which has once amplified by the input/differential-amplifier stage 216 and may therefore be substituted by any other form of amplifier circuit capable of achieving results basically similar to those achievable by the stage 252 herein shown.

Assume now that the common-mode input voltage applied to the input terminals 204 and 206 of the operational amplifier circuit is of a relatively low level approximating the voltage on the low-level source voltage supply line 202. With such a low-level common-mode input voltage appearing at each of their gates, the n-channel MOS transistors 218 and 220 of the first differential transistor pair 218/220 are turned off and the p-channel MOS transistors 222 and 224 of the second differential transistor pair 222/224 are turned on. The mode regulating and current-source transistors 244 and 246 are turned on in the presence of the first and second reference voltages $V_{R1}$ and $V_{R2}$ established by the reference voltage generator stage 208. A current ($I_o$) is thus allowed to flow from the low-level source voltage supply line 202 solely to the input node of the third current mirror circuit 238 through the serially connected current-source and mode regulating transistors 246 and 244. The current ($I_o$) thus flowing to the input node of the current mirror circuit 238 is passed through the diode-coupled transistor 240 of the current mirror circuit 238 and, due to the current mirror action of the circuit 238, causes a substantially equal current to flow through the other transistor 242 of the current mirror circuit 238. The current ($I_o$) thus passed through the transistor 242 of the current mirror circuit 238 is divided into two equal fractions ($I_o/2$) which flow through the transistors 222 and 224, respectively, of the second differential transistor pair 222/224 with equal voltages applied to the gates of the transistors 222 and 224. A differential amplifier circuit is thus formed which has input devices implemented by the transistors 222 and 224 and an active load device implemented by the fourth current mirror circuit 248 composed of the n-channel MOS transistors 250 and 252.

As the common-mode input voltage appearing at the input terminals 204 and 206 of the circuit rises away from the voltage level on the low-level source voltage supply line 202, currents (denoted by $i_1$ and $i_2$ in FIG. 5) begin to flow increasingly through the n-channel MOS transistors 218 and 220 of the first differential transistor pair 218/220. The current ($I_o$) allowed to pass through the current-source transistor 246 being fixed, the current flowing through the transistor 240 of the third current mirror circuit 238 is reduced to the difference (denoted by $i_3$ in FIG. 5) between the current ($I_o$) flowing through the current-source transistor 246 and the sum of the currents ($i_1+i_2$) flowing through the differential-pair transistors 218 and 220. As the currents ($i_1, i_2$) through the differential-pair transistors 218 and 220 increase, the current allowed to flow through the transistor 240 of the third current mirror circuit 238 thus decreases. The transistor 240 of the current mirror circuit 238 is mirrored off by the current through the other transistor 242 of the current mirror circuit 238 so that a current equal to the current ($i_3$) through the transistor 240 flows through the transistor 242. On the other hand, the current ($i_1$) which flows through one transistor 218 of the first differential transistor pair 218/220 and accordingly the diode-coupled transistor 228 of the first current mirror circuit 226 is mirrored off by the current which flows through the other transistor 230 of the current mirror circuit 226. The current ($i_1$) thus passed through the transistor 230 of the first current mirror circuit 226 is added to the current ($i_3/2$) passed through the transistor 224 of the second differential transistor pair 222/224 at the input node $N_1$ of the fourth current mirror circuit 248. Likewise, the current ($i_2$) which flows through the other transistor 220 of the first differential transistor pair 218/220 and accordingly the diode-coupled transistor 234 of the second current mirror circuit 232 is mirrored off by the current which flows through the other transistor 236 of the current mirror circuit 232. The current ($i_2$) thus passed through the transistor 236 of the second current mirror circuit 232 is added to the current ($i_3/2$) passed through the other transistor 222 of the second differential transistor pair 222/224 at the output node $N_2$ of the fourth current mirror circuit 248. A current totalling to $i_1+i_3/2$ occurs at the input node $N_1$ of the current mirror circuit 248 and likewise a current totalling to $i_2+i_3/2$ occurs at the output node $N_2$ of the current mirror circuit 248. Considering that the currents ($i_1$, $i_2$) which flow through the transistors 218 and 220 of the differential transistor pair 218/220 are substantially equal to each other, the current $i_1+i_3/2$ or $i_2+i_3/2$ thus appearing at each of the input and output nodes $N_1$ and $N_2$ of the fourth current mirror circuit 238 is substantially equal to $(i_1+i_2+i_3)/2=I_o/2$, viz., to one half of the current ($I_o$) which flows through the current-source transistor 246. This means that the current to flow through each of the nodes $N_1$ and $N_2$ is fixed by means of the second mode regulating transistor 246 without respect to the common-mode input voltage applied to the input terminals 204 and 206 of the operational amplifier circuit.

The increasing common-mode input voltage will then become considerably higher than the first reference voltage $V_{R1}$ established in the reference voltage generator stage 208 and applied to the gate of the first mode regulating transistor 244. The first mode regulating transistor 244 is now turned off so that the current ($I_o$) through the second mode regulating transistor 246 is divided into two equal fractions ($I_o/2$) which totally flows to the transistors 218 and 220, respectively, of the first differential transistor pair 218/220. Under these conditions, a differential amplifier circuit is formed which includes input devices implemented by the differential-pair transistors 218 and 220 and load devices implemented by the transistors 230 and 234 of the first and second current mirror circuits 226 and 232, respectively. These transistors 230 and 234 of the first and second current mirror circuits 228 and 232 are mirrored off by the associated transistors 230 and 236, respectively, of the current mirror circuits 226 and 232 with the result that a current ($I_o/2$) equal to one half of the current ($I_o$) flowing through the current-source transistor 246 appears at each of the input and output nodes $N_1$ and $N_2$ of the fourth current mirror circuit 248 implementing the active load device of the operational amplifier circuit which is presently in effect. This means that the operational amplifier circuit is operable with a common-mode input voltage which may be as high as the voltage on the high-level source voltage supply line 200. It may further be noted that the sum of the currents ($I_o/2$) transmitted to the active load device of such an operational amplifier circuit is exactly equal to the current ($I_o$) which flows through the second mode regulating transistor 246 and for this reason no switching noises will be produced during transition of the common-mode input voltage through the voltage level of the first reference voltage $V_{R1}$ established by the state 208.

Figure 6:
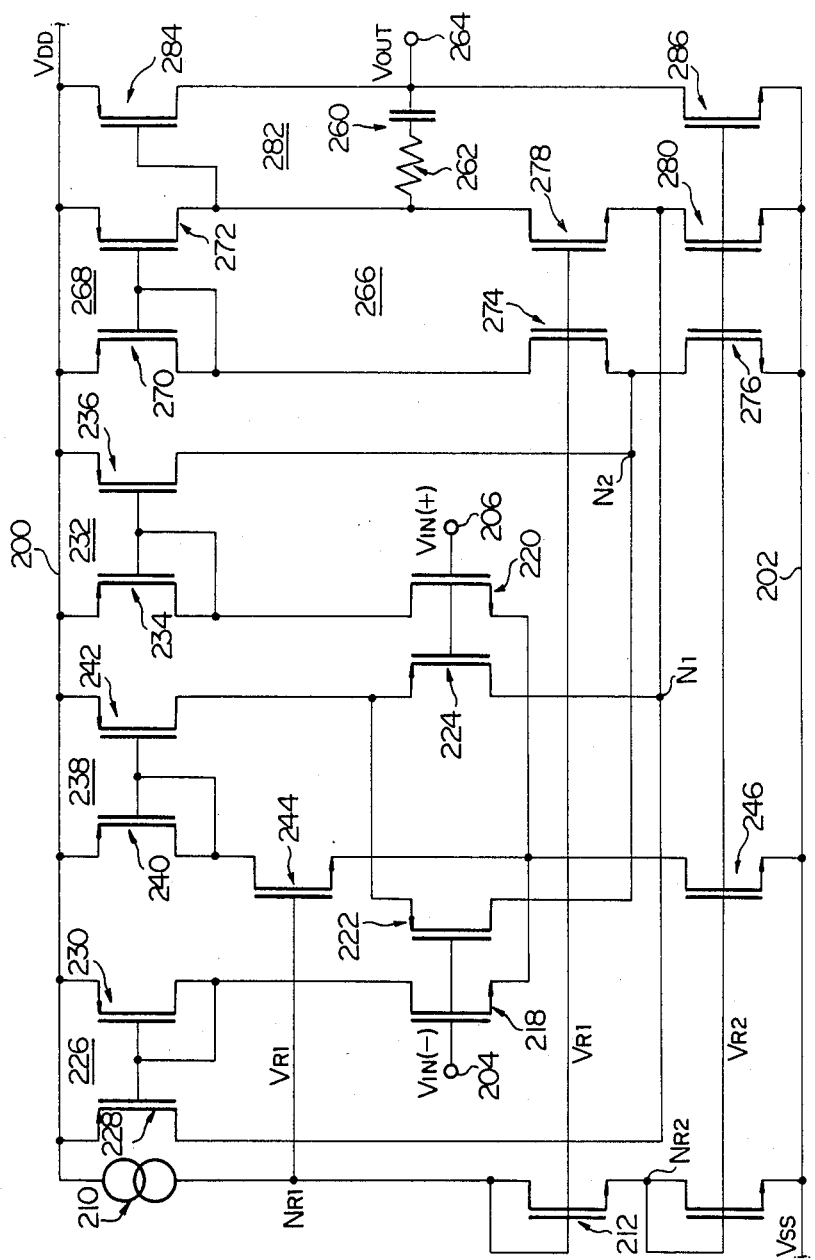
FIG. 6 is a circuit diagram showing a second preferred embodiment of a single-ended operational amplifier circuit according to the present invention.

FIG. 6 shows a modification of the embodiment of an operational amplifier circuit according to the present invention as hereinbefore described with reference to FIG. 5. The modified embodiment herein shown is largely similar to the embodiment described with reference to FIG. 5 but is characterized by the use of a cascode circuit in substitution for the fourth current mirror circuit 248 incorporated in the embodiment of FIG. 5.

In the embodiment of FIG. 6, the cascode circuit, represented in its entirety by reference numeral 266, comprises a current mirror circuit 268 consisting of a diode-coupled p-channel MOS transistor 270 and a p-channel MOS transistor 272 which have their gates connected together and their sources connected directly to the high-level source voltage supply line 200. Such a current mirror circuit 268 has an input node provided by the gate and drain of the diode-coupled p-channel MOS transistor 270 and connected to the low-level source voltage supply line 202 through a series combination of n-channel MOS transistors 274 and 276 and an output node provided by the drain of the p-channel MOS transistor 272 and connected to the low-level source voltage supply line 202 through a series combination of n-channel MOS transistors 278 and 280. The n-channel MOS transistors 274 and 278 have their gates jointly connected to the first reference voltage node $N_{R1}$ of the reference voltage generator stage 208 and their sources connected to the drains of the transistors 270 and 272, respectively, of the current mirror circuit 268. The n-channel MOS transistors 276 and 280 have their gates jointly connected to the second reference voltage node $N_{R2}$ of the reference voltage generator stage 208 and their sources connected to the drains of the transistors 274 and 278, respectively, the sources of the transistors 276 and 280 being connected to the low-level source voltage supply line 202. These transistors 276 and 280 implement constant-current-source devices responsive to the second reference voltage $V_{R2}$ established in the reference voltage generator stage 208. On the other hand, the transistors 274 and 276 implement constant-current load devices responsive to the first reference voltage $V_{R1}$ established in the reference voltage generator stage 208.

In the operational amplifier circuit shown in FIG. 6, an inverter-type gain/output stage, now designated by numeral 282, comprises a series combination of p-channel an n-channel MOS transistors 284 and 286 connected between the source voltage supply lines 200 and 202. The p-channel MOS transistor 284 has its gate connected to the output node of the current mirror circuit 268 and its source connected to the high-level source voltage supply lines 200 and implements an input device in the gain/output stage 282. The n-channel MOS transistor 286 has its gate connected to the second reference voltage node $N_{R2}$ of the reference voltage generator stage 208, its drain connected to the drain of the p-channel MOS transistor 284 and its source connected to the low-level source voltage supply lines 202, implementing a constant-current load device of the gain/output stage 282. The gain/output stage 282 further comprises a phase compensation Miller circuit comprising a series combination of a compensation capacitor 260 and a compensation resistor 264 connected between a node between the transistors 272 and 278 of the cascode circuit 266 and a node between the transistors 284 and 286 of the gain/output stage 282 as shown. Thus, the output voltage of the input/differential-amplifier stage 216 as appearing at the node between the transistors 272 and 278 of the cascode circuit 266 is, upon further amplification by the gain/output stage 254, appears as an output signal $V_2$ at the node between the transistors 284 and 286 and is passed over to a suitable load element or any other type of subsequent circuit stage (not shown) through a single-ended circuit output terminal 264. The inverter-type gain/output stage 286 thus constructed and arranged may also be substituted by any other form of amplifier circuit capable of achieving results basically similar to those achievable by the stage 282 herein shown.

The operational amplifier circuit constructed and arranged as hereinbefore described is essentially similar in operation to the circuit described with reference to FIG. 5. During the mode of operation when the supplied common-mode input voltage is of a relatively low level approximating the voltage on the low-level source voltage supply line 202, an operational amplifier circuit is formed which has input devices implemented by the differential-pair p-channel MOS transistors 222 and 224 and a cascode stage implemented by the n-channel Mos transistors 274, 276, 278 and 280 and p-channel MOS transistor 272 forming part of the current mirror circuit 268. As the common-mode input voltage increases thereafter, the operational amplifier circuit operates similarly to the circuit described with reference to FIG. 5. Thus, the current passed through the transistor 230 of the current mirror circuit 226 is added to the current passed through the transistor 224 of the second differential transistor pair 222/224 at the node $N_1$ between the drains of the transistors 224 and 230 and, likewise, the current passed through the transistor 236 of the second current mirror circuit 232 is added to the current passed through the transistor 222 of the second differential transistor pair 222/224 at the node $N_2$ between the drains of the transistors 222 and 236. The current appearing at each of the nodes $N_1$ and $N_2$ is substantially equal to one half of the current which flows through the mode regulating transistor 246 as described in connection with the embodiment of FIG. 5.

As the common-mode input voltage is increased beyond the first reference voltage $V_{R1}$ established in the reference voltage generator stage 208, a differential amplifier circuit is formed which includes input devices implemented by the differential-pair transistors 218 and 220 and load devices implemented by the transistors 230 and 234 of the first and second current mirror circuits 226 and 232, respectively. These transistors 230 and 234 of the first and second current mirror circuits 226 and 232 are mirrored off by the associated transistors 230 and 236, respectively, of the current mirror circuits 230 and 232 with the result that a current equal to one half of the current flowing through the second mode regulating transistor 246 is passed to the cascode circuit 266 through each of the nodes $N_1$ and $N_2$. The differential amplifier circuit under consideration is thus also operable with a common-mode input voltage which may be as high as the voltage on the high-level source voltage supply line 200. The sum of the currents transmitted to the cascode circuit 266 of such a differential amplifier circuit is exactly equal to the current which flows through the second mode regulating transistor 246 and for this reason no switching noises will be produced during transition of the common-mode input voltage through the voltage level of the first reference voltage $V_{R1}$ established by the stage 208.

Figure 7:
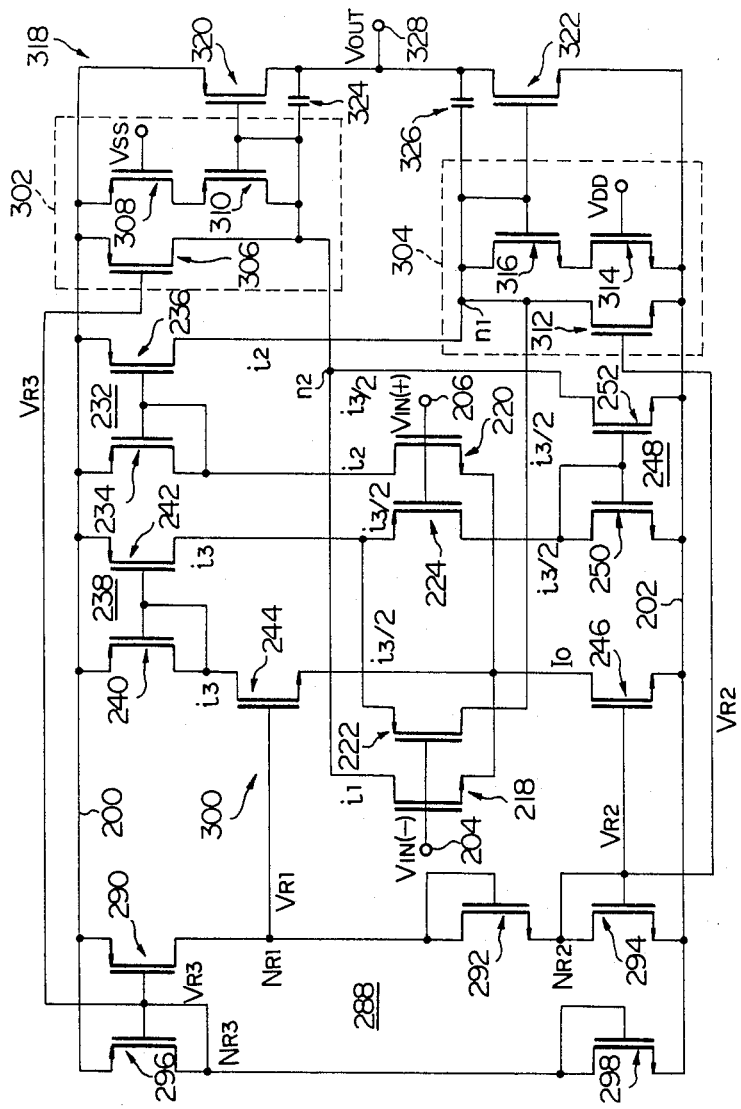
FIG. 7 is a circuit diagram showing a third preferred embodiment of a single-ended operational amplifier circuit according to the present invention.

FIG. 7 shows a third preferred embodiment of a single-ended operational amplifier circuit according to the present invention. The operational amplifier circuit is also provided between voltage supply lines 200 and 202 through which are to be supplied a high-level source voltage $V_{DD}$ and a low-level source voltage $V_{SS}$, respectively. The operational amplifier circuit has a pair of input terminals 204 and 206 through which inverted and non-inverted input voltages $V_{IN(-)}$ and $V_{IN(-)}$, respectively, are to be normally supplied.

The operational amplifier circuit shown further has a reference voltage generator stage 288 which consists essentially of a series combination of a p-channel MOS transistor 290 and diode-coupled n-channel MOS transistors 292 and 294 connected between the high-level and low-level source voltage supply lines 200 and 202 and a series combination of a p-channel MOS transistor 296 and a diode-coupled n-channel MOS transistor 298 also connected between the source voltage supply line 200 and 202. The p-channel MOS transistors 290 and 296 form in combination a current mirror circuit with their gates connected together and their sources connected to the high-level source voltage supply line 200. The n-channel MOS transistor 292 has its gate and drain connected to the drain of the transistor 290, and the n-channel MOS transistor 294 has its gate and drain connected to the source of the MOS transistor 292 and its source connected directly to the low-level source voltage supply line 202. These n-channel MOS transistors 292 and 294 act as load devices in the reference voltage generator stage 288, which is thus operative to produce a first reference voltage $V_{R1}$ at a node $N_{R1}$ between the p-channel and n-channel MOS transistors 290 and 292 and a second reference voltage $V_{R2}$ at a node $N_{R2}$ between the diode-coupled n-channel MOS transistors 292 and 294. It will be apparent that the second reference voltage $V_{R2}$ at the node $N_{R2}$ is lower than the first reference voltage $V_{R1}$ at the node $N_{R1}$ by a value approximately equal to the threshold volume of the transistor 292. On the other hand, the diode-coupled n-channel MOS transistor 298 serially connected to the p-channel 296 forming part of the current mirror circuit 290/296 has its gate and drain connected to the drain of the transistor 296 and its source directly connected to the low-level source voltage supply line 202. Thus, the reference voltage generator stage 288 further has a third reference voltage $V_{R3}$ produced at a node $N_{R3}$ between the transistors 296 and 298.

The operational amplifier circuit shown in FIG. 7 further has an input/differential-amplifier stage 300 which comprises a first differential transistor pair consisting of source-coupled n-channel MOS transistors 218 and 220 and a second differential transistor pair consisting of source-coupled p-channel MOS transistors 222 and 224. One n-channel MOS transistor 218 of the first differential transistor pair and one p-channel MOS transistor 222 of the second differential transistor pair have their respective gates connected to one input terminal 204 of the operational amplifier circuit and the other n-channel MOS transistor 220 of the first differential transistor pair and the other p-channel MOS transistor 224 of the second differential transistor pair have their respective gates connected to the other input terminal 206 of the operational amplifier circuit. The input/differential-amplifier stage 300 further comprises a first current mirror circuit 232 consisting of a diode-coupled p-channel MOS transistor 234 and a p-channel MOS transistor 236, and a second current mirror circuit 238 consisting of a diode-coupled p-channel MOS transistor 240 and a p-channel MOS transistor 242. The p-channel MOS transistors 234 and 236 forming the first current mirror circuit 232 have their gates connected together and their sources connected directly to the high-level source voltage supply line 200. The first current mirror circuit 232 has an input node connected to the gates of the transistors 234 and 236 and to the drain of the diode-coupled transistor 234 and an output node $n_1$ connected to the drain of the transistor 236. Furthermore, the p-channel MOS transistors 240 and 242 forming the second current mirror circuit 238 have their gates connected together and their sources connected directly to the high-level source voltage suply line 200. The second current mirror circuit 238 has an input node connected to the gates of the transistors 240 and 242 and to the drain of the diode-coupled transistor 240 and an output node connected to the drain of the transistor 242. The first current mirror circuit 232 has its input node connected to the drain of one n-channel MOS transistor 220 of the second differential transistor pair 218/220 and its output node $n_1$ connected to the drain of one p-channel MOS transistor 222 of the second differential transistor pair 222/224. The second current mirror circuit 238 has its input node connected through the current path of an n-channel MOS transistor 244 to the common sources of the n-channel MOS transistors 218 and 220 of the first differential transistor pair 218/220 and its output node connected directly to the common sources of the p-channel MOS transistors 222 and 224 of the second differential transistor pair 222/224. The input node of the second current mirror circuit 238 is further connected to the low-level source voltage supply line 12 through the transistor 244 and the current path of an n-channel MOS transistor 246. The n-channel MOS transistors 244 and 246 are thus serially connected between the input node of the second current mirror circuit 238 and the low-level source voltage supply line 12 and have their gates connected to the first and second reference voltage nodes $N_{R1}$ and $N_{R2}$ of the reference voltage generator stage 288. More specifically, the n-channel MOS transistor 244 has its gate connected to the node $N_{R1}$ between the p-channel MOS transistor 290 and the diode-coupled n-channel MOS transistor 292 and the n-channel MOS transistor 246 has its gate connected to the node $N_{R2}$ between the diode-coupled n-channel MOS transistors 292 and 294. The transistor 246 implements a constant-current-source device and the transistor 244 implements a current steering device which regulates the mode of operation of the differential amplifier circuit. These transistors 244 and 246 operate with the first and second reference voltages $V_{R1}$ and $V_{R2}$, respectively, produced by the reference voltage generator stage 288. The transistors 244 and 246 will thus be hereinafter referred to as a mode regulating transistor and a current-source transistor, respectively, as in the embodiment described with reference to FIG. 5.

The input/differential-amplifier stage 300 further compriese a third current mirror circuit 248 consisting of a diode-coupled n-channel MOS transistor 250 and an n-channel MOS transistor 252. The n-channel MOS transistors 250 and 252 forming the third current mirror circuit 248 have their gates connected together and their sources connected directly to the low-level source voltage supply line 202. The third current mirror circuit 248 has an input node connected to the drain of the other p-channel MOS transistor 224 of the second differential transistor air 222/224 and an output node $n_2$ connected to the drain of the other n-channel MOS transistor 218 of the first differential transistor pair 218/220. Thus, the input/differential-amplifier stage 300 has an output voltage appearing between the output nodes $n_1$ and $n_2$ of the first and third current mirror circuit 232 and 248, respectively.

The input/differential-amplifier stage 300 further comprises first and second load circuits 302 and 304. The first load circuit 302 comprises a constant-current source device implemented by a p-channel MOS transistor 306 which is paralleled by a series combination of a p-channel MOS transistor 308 and a diode-coupled p-channel MOS transistor 310. the p-channel MOS transistor 306 has its gate connected to the third reference voltage node $N_{R3}$ of the reference voltage generator stage 288, its source connected to the high-level source voltage supply line 200, and its drain connected to the output node $n_2$ of the third current mirror circuit 248. The p-channel MOS transistor 308 has its gate connected to the low-level source voltage supply line 202 and its source connected to the high-level source voltage supply line 200 and acts as a resistor for the diode-coupled p-channel MOS transistor 310 which has its source connected to the drain of the transistor 308 and its drain connected in parallel with the transistor 306 to the output node $n_2$ of the third current mirror circuit 248. On the other hand, the second load circuit 304 comprises a constant-current source device implemented by an n-channel MOS transistor 312 which is paralleled by a series combination of an n-channel MOS transistor 314 and a diode-coupled n-channel MOS transistor 316. The n-channel MOS transistor 312 has its gate connected to the second reference voltage node $N_{R2}$ of the reference voltage generator stage 288, its source connected to the low-level source voltage supply line 202, and its drain connected to the output node $n_1$ of the second current mirror circuit 232. The n-channel MOS transistor 314 has its gate connected to the high-level source voltage supply line 200 and its source connected to the low-level source voltage supply line 202 and acts as a resistor for the diode-coupled n-channel MOS transistor 316 which has its source connected to the drain of the transistor 314 and its drain connected in parallel with the transistor 312 to the output node $n_1$ of the second current mirror circuit 232.

The operational amplifier circuit shown in FIG. 7 further comprises a gain/output stage 318 comprising a series combination of push-pull amplifier output devices respectively implemented by p-channel and n-channel MOS transistors 320 and 322 connected between the source voltage supply lines 200 and 202. The p-channel MOS transistor 320 has its gate connected to the gate of the diode-coupled transistor 310 of the first load circuit 302 and its source directly connected to the high-level source voltage supply line 200. Likewise, the n-channel MOS transistor 322 has its gate connected to the gate of the diode-coupled transistor 316 of the second load circuit 304 and its source directly connected to the low-level source voltage supply line 202. The gain/output stage 318 thus constructed has a single-ended circuit output terminal 328 connected to a node between these push-pull transistors 320 and 322 and to the first and second load circuits 302 and 304 across phase compensation capacitors 324 and 326, respectively, as shown.

Assume now that the common-mode input voltage applied to the input terminals 204 and 206 of the operational amplifier circuit is of a relatively low level approximating the voltage on the low-level source voltage supply line 202. With such a low-level common-mode input voltage appearing at each of their gates, the n-channel MOS transistors 218 and 220 of the first differential transistor pair 218/220 are turned off and the p-channel MOS transistors 222 and 224 of the second differential transistor pair 222/224 turned on. The mode regulating and current-source transistors 244 and 246 are turned on in the presence of the first and second reference voltages $V_{R1}$ and $V_{R2}$ established by the reference voltage generator stage 288. A current ($I_o$) is thus allowed to flow from the low-level source voltage supply line 202 solely to the input node of the second current mirror circuit 238 through the serially connected mode regulating and current-source transistors 246 and 244. The current ($I_o$) thus flowing to the input node of the current mirror circuit 238 is pased through the diode-coupled transistor 240 of the current mirror circuit 238 and, due to the current mirror action of the circuit 238, causes a substantially equal current to flow through the other transistor 242 of the current mirror circuit 238. The current ($I_o$) thus passed through the transistor 242 of the current mirror circuit 238 is divided into two equal fractions ($I_o/2$) which flow through the transistors 222 and 224, respectively, of the second differential transistor pair 222/224 with equal voltages applied to the gates of the transistors 222 and 224. An operational amplifier circuit is thus formed which has input devices implemented by the transistors 222 and 224 with the transistor 222 loaded by the second load circuit 304 through the node $n_1$ and the transistor 224 loaded by the first load circuit 302 through the third current mirror circuit 248 and the node $n_2$.

As the common-mode input voltage appearing at the input terminals 204 and 206 of the circuit rises away from the voltage level on the low-level source voltage supply line 202, currents (denoted by $i_1$ and $i_2$ in FIG. 7) begin to flow increasingly through the n-channel MOS transistors 218 and 220 of the first differential transistor pair 218/220. The current ($I_o$) allowed to pass through the current-source transistor 246 being fixed, the current flowing through the transistor 240 of the second current mirror circuit 238 is reduced to the difference (denoted by $i_3$ in FIG. 7) between the current ($I_o$) flowing through the current-source transistor 246 and the sum of the currents ($i_1+i_2$) flowing through the differential-pair transistors 218 and 220. As the currents ($i_1$, $i_2$) through the differential-pair transistors 218 and 220 increase, the current allowed to flow through the transistor 240 of the second current mirror circuit 238 thus decreases. The transistor 240 of the current mirror circuit 238 is mirrored off by the current through the other transistor 242 of the current mirror circuit 238 so that a current equal to the current ($i_3$) through the transistor 240 flows through the transistor 242. On the other hand, the current ($i_1$) which flows through one transistor 218 of the first differential transistor pair 218/220 is directed toward the first load circuit 302 through the node $n_2$. To the current ($i_1$) thus passed toward the first load circuit 302 from the transistor 218 is added the current ($i_3/2$) passed through the transistor 252 of the third current mirror circuit at the output node $n_2$ of the current mirror circuit 248. Likewise, the current ($i_2$) which flows through the other transistor 220 of the first differential transistor pair 218/220 and accordingly the diode-coupled transistor 234 of the first current mirror circuit 232 is mirrored off by the current which flows through the other transistor 236 of the current mirror circuit 232. The current ($i_2$) thus passed through the transistor 236 of the first current mirror circuit 232 is added to the current ($i_3/2$) passed through the other transistor 222 of the second differential transistor pair 222/224 at the output node $n_1$ of the first current mirror circuit 232. A current totalling to $i_1+i_3/2$ occurs at the output node $n_2$ of the third current mirror circuit 248 and likewise a current totalling to $i_2+i_3/2$ occurs at the output node $n_1$ of the first current mirror circuit 236. Considering that the currents ($i_1$, $i_2$) which flow through the transistors 218 and 220 of the differential transistor pair 218/220 are substantially equal to teach other, the current $i_1+i_3/2$ or $i_2+i_3/2$ thus appearing at each of the output nodes $n_2$ and $n_1$ of the current mirror circuits 248 and 232 is substantially equal to $I_o/2$, viz., to one half of the current ($I_o$) which flows through the current-source transistor 246. As noted previously, this means that the current the flow through each of the nodes $n_1$ and $n_2$ is fixed by means of the current-source transistor 246 without respect to the common-mode input voltage applied to the input terminals 204 and 206 of the differential amplifier circuit.

The increasing common-mode input voltage will then become considerably higher than the first reference voltage $V_{R1}$ established in the reference voltage generator stage 288 and applied to the gate of the mode regulating transistor 244. The mode regulating transistor 244 is now turned off so that the current ($I_o$) through the second mode regulating transistor 246 is divided into two equal fractions ($I_o/2$) which totally flows to the transistors 218 and 220, respectively, of the first differential transistor pair 218/220. Under these conditions, a differential amplifier circuit is formed which includes input devices implemented by the differential-pair transistors 218 and 220 with the transistor 218 loaded by the first load circuit 302 through the node $n_2$ and the transistor 220 loaded by the second load circuit 304 through the first current mirror circuit 232 and the node $n_1$. A current ($I_o/2$) equal to one half of the current ($I_o$) flowing through the current-source transistor 246 appears at each of the output nodes $n_2$ and $n_1$ of the current mirror circuits 248 and 232. This means that the operational amplifier circuit is operable with a common-mode input voltage which may be as high as the voltage on the high-level source voltage supply line 200. It may further be noted that the sum of the currents ($I_o/2$) transmitted to the load circuits 302 and 304 of such a differential amplifier circuit is exactly equal to the current ($I_o$) which flows through the current-source transistor 246 and for this reason no switching noises will be produced during transistion of the common-mode input voltage through the voltage level of the first reference voltage $V_{R1}$ established by the stage 288.

While only a few preferred embodiments of an operational amplifier circuit according to the present invention have thus far been described with reference to the drawings, such embodiments are merely illustrative of the gist of the present invention and are for this reason subject to change and modification where desired. Thus, the channel conductivities of the MOS transistors used in each of the embodiments described may be inversed or the MOS transistors shown or those having the inversed channel conductivities may be substituted by bipolar devices of appropriate conductivity types. Where bipolar transistors are thus used to form an operational amplifier circuit according to the present invention, any bipolar transistor having an emitter directly connected to the high-level or low-level source voltage supply line 200 or 202 may preferably have a resistor of from tens to hundreds of ohms interconnected between the emitter and the source voltage supply line.

What is claimed is:

1. An operational amplifier circuit comprising
   (a) first and second source voltage supply lines,
   (b) a pair of input terminals,
   (c) a first differential transistor pair consisting of first and second transistors of a first conductivity type, said first and second transistors having respective control terminals connected to said input terminals, respectively, and respective current input terminals connected together, each of the first and second transistors further having a current output terminal,
(d) a second differential transistor pair consisting of third and fourth transistors of a second conductivity type opposite to said first conductivity type, said third and fourth transistors having respective control terminals also connected to said input terminals, respectively, and respective current input terminals connected together, each of the third and fourth transistors further having a current output terminal,
(e) a first current mirror circuit responsive to the current on said first source voltage supply line and having an input terminal connected to the current output terminal of said first transistor and an output terminal connected to the current output terminal of said fourth transistor through a first node,
(f) a second current mirror circuit responsive to the current on said first source voltage supply line and having an input terminal connected to the current output terminal of said second transistor and an output terminal connected to the current output terminal of said third transistor through a second node,
(g) a third current mirror circuit responsive to the current on said first source voltage supply line and having an input terminal connected to the current input terminal of each of said first and second transistors and an output terminal connected to the current input terminal of each of said third and fourth transistors,
(h) reference voltage generator means operative to produce predetermined first and second reference voltages,
(i) a first constant-current source device responsive to said first reference voltage and connected between the input terminal of said third current mirror circuit and the current input terminal of each of said first and second transistors,
(j) a second constant-current source device responsive to said second reference voltage and connected between said second source voltage supply line and the current input terminal of each of said first and second transistors,
(k) a fourth current mirror circuit responsive to the current on said second source voltage supply line and having an input terminal connected to said first node and an output terminal connected to said second node, and
(l) inverting amplifier means having an input terminal connected to said second node and an output terminal, the inverting amplifier means comprising a phase compensation circuit connected between the input and output terminals thereof.

2. An operational amplifier circuit comprising
(a) first and second source voltage supply lines,
(b) a pair of input terminals,
(c) a first differential transistor pair consisting of first and second transistors of a first conductivity type, said first and second transistors having respective control terminals connected to said input terminals, respectively, and respective current input terminals connected together, each of the first and second transistors further having a current output terminal,
(d) a second differential transistor pair consisting of third and fourth transistors of a second conductivity type opposite to said first conductivity type, said third and fourth transistors having respective control terminals also connected to said input terminals, respectively, and respectively current input terminals connected together, each of the third and fourth transistors further having a current output terminal,
(e) a first current mirror circuit responsive to the current on said first source voltage supply line and having an input terminal connected to the current output terminal of said first transistor and an output terminal connected to the current output terminal of said fourth transistor through a first node,
(f) a second current mirror circuit responsive to the current on said first source voltage supply line and having an input terminal connected to the current output terminal of said second transistor and an output terminal connected to the current output terminal of said third transistor through a second node,
(g) a third current mirror circuit responsive to the current on said first source voltage supply line and having an input terminal connected to the current input terminal of each of said first and second transistors and an output terminal connected to the current input terminal of each of said third and fourth transistors,
(h) reference voltage generator means operative to produce predetermined first and second reference voltages,
(i) a first constant-current source device responsive to said first reference voltage and connected between the input terminal of said third current mirror circuit and the current input terminal of each of said first and second transistors,
(j) a second constant-current source device responsive to said second reference voltage and connected between said second source voltage supply line and the current input terminal of each of said first and second transistors,
(k) a third constant-current source device responsive to said second reference voltage and connected between said second source voltage supply line and said second node,
(l) a fourth constant-current source device responsive to said second reference voltage and connected between said second source voltage supply line and said first node,
(m) a fourth current mirror circuit responsive to the current on said first source voltage supply line and having an input terminal connected to said third constant-current source device through a first load device and an output terminal connected to said fourth constant-current source device through a second load device,
(n) each of said first and second load devices being responsive to said first reference voltage, and
(o) inverting amplifier means having an input terminal connected to the output terminal of said fourth current mirror circuit and an output terminal, the inverting amplifier means comprising a phase compensation circuit connected between the input and output terminals thereof.

3. An operational amplifier circuit comprising
(a) first and second source voltage supply lines,
(b) a pair of input terminals
(c) a first differential transistor pair consisting of first and second transistors of a first conductivity type, said first and second transistors having respective control terminals connected to said input terminals, respectively, and respective current input terminals connected together, each of the first and second transistors further having a current output terminal, (d) a second differential transistor pair consisting of third and fourth transistors of a second conductivity type oppsoite to said first conductivity type, said third and fourth transistors having respective control terminals also connected to said input terminals, respectively, and respective current input terminals connected together, each of the third and fourth transistors further having a current output terminal, (e) a first current mirror circuit responsive to the current on said first source voltage supply line and having an input terminal connected to the current output terminal of said second transistor and an output terminal connected to the current output terminal of said third transistor through a first node, (f) a second current mirror circuit responsive to the current on said first source voltage supply line and having an input terminal connected to the current input terminal of each of said first and second transistors and an output terminal connected to the current input terminal of each of said third and fourth transistors, (g) a third current mirror circuit responsive to the current on said second source voltage supply line and having an input terminal connected to the current output terminal of said fourth transistor and an output terminal connected to the current output terminal of said first transistor through a second node, (h) reference voltage generaor means operative to produce predetermined first, second and third reference voltages, (i) a first constant-current source device responsive to said first reference voltage and connected between the input terminal of said second current mirror circuit and the current input terminal of each of said first and second transistors, (j) a second constant-current source device responsive to said second reference voltage and connected between said second source voltage supply line and the current input terminal of each of said first and second transistors, (k) a first load circuit responsive to said third reference voltage and having a current input terminal connected to said first source voltage supply line and a current output terminal connected to said second node, (l) a second load circuit responsive to said second reference voltage and having a current input terminal connected to said second source voltage supply line and a current output terminal connected to said first node, and (m) an amplifier means having input terminals connected to the current output terminals of said first and second load circuits and an output terminals, the amplifier means comprising phase compensation means connected between each of the input terminals and the output terminal thereof.

4. An operational amplifier as set forth in claim 3, in which said first load circuit comprises a constant-current source device responsive to said third reference voltage and having a current input terminal connected to said first source voltage supply line and a current output terminal connected to said second node, and a series combination of a diode-coupled transistor and a resistor which are connected in parallel with said constant-current source device of the first load circuit, said diode-coupled transistor being of said second conductivity type, said second load circuit comprises a constant-current source device responsive to said second reference voltage and having a current input terminal connected to said second source voltage supply line and a current output terminal connected to said first node, and a series combination of a diode-coupled transistor and a resistor which are connected in parallel with said constant-current source device of the second load circuit, said diode-coupled transistor of the second load circuit being of said first conductivity type, and said amplifier means comprises a series combination of a first output transistor having said second conductivity type and a second output transistor having said first conductivity type which are connected between said first and second source voltage supply lines, said phase compensation means comprising a capacitor connected between the current output terminal of said first load circuit and a node between said first and second output transistors and a capacitor connected between the current output terminal of said second load circuit and the node between said first and second output transistors.

* * * * *

UNITED STATES PATENT AND TRADEMARK OFFICE
CERTIFICATE OF CORRECTION

PATENT NO. : 4,766,394

DATED : August 23, 1988

INVENTOR(S) : Yukawa

It is certified that error appears in the above-identified patent and that said Letters Patent is hereby corrected as shown below:

| | |
|---|---|
| COLUMN 1, LINE 38 | Delete "later" insert --late--; |
| COLUMN 6, LINE 33 | Delete "$F_{R2}$" and insert --$V_{R2}$--; |
| COLUMN 6, LINE 45 | Delete "in put" and insert --input--; |
| COLUMN 8, LINE 56 | Delete "13" and insert --136--; |
| COLUMN 13, LINE 32 | Delete "$N_{RR1}$" and insert --$N_{R1}$--; |
| COLUMN 14, LINE 13 | Delete "246" insert --236--; |
| COLUMN 14, LINE 47 | Delete "ahve" insert --have--; |
| COLUMN 14, LINE 44 | Delete "236" insert --246--; |
| COLUMN 20, LINE 26 | Delete "volume" insert --voltage--; |
| COLUMN 21, LINE 56 | Delete "air" insert --pairs-- |
| COLUMN 27, LINE 36 | Delete "generaor" insert --generator--; |

Signed and Sealed this

Twenty-seventh Day of June, 1989

Attest:

DONALD J. QUIGG

*Attesting Officer*  *Commissioner of Patents and Trademarks*